(12) United States Patent
Lee et al.

(10) Patent No.: US 8,431,462 B2
(45) Date of Patent: Apr. 30, 2013

(54) METHODS OF MANUFACTURING SEMICONDUCTOR DEVICES

(75) Inventors: Kwan-Heum Lee, Suwon-si (KR);
Soon-Wook Jung, Hwaseong-si (KR);
Jung-Hyun Park, Seoul (KR); Wook-Je Kim, Gwacheon-si (KR); Jong-Sang Ban, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/183,630

(22) Filed: Jul. 15, 2011

(65) Prior Publication Data
US 2012/0015490 A1    Jan. 19, 2012

(30) Foreign Application Priority Data
Jul. 15, 2010    (KR) .................. 10-2010-0068207

(51) Int. Cl.
  *H01L 21/337*    (2006.01)
  *H01L 21/8238*   (2006.01)
  *H01L 21/336*    (2006.01)
  *H01L 27/12*     (2006.01)
(52) U.S. Cl.
  USPC ........... 438/306; 438/184; 438/231; 257/351; 257/E21.409; 257/E21.634

(58) Field of Classification Search .................. None
See application file for complete search history.

(56) References Cited

U.S. PATENT DOCUMENTS

| 7,585,739 B2 * | 9/2009 | Saiki et al. .................... 438/306 |
| 2007/0132027 A1 * | 6/2007 | Chidambaram .............. 257/351 |
| 2007/0202640 A1 * | 8/2007 | Al-Bayati et al. ............ 438/184 |
| 2008/0164491 A1 | 7/2008 | Liu et al. |
| 2010/0029053 A1 | 2/2010 | Itokawa et al. |

FOREIGN PATENT DOCUMENTS

JP    2006-59843 A    3/2006

* cited by examiner

*Primary Examiner* — Fernando L Toledo
*Assistant Examiner* — Valerie N Newton
(74) *Attorney, Agent, or Firm* — Sughrue Mion, PLLC

(57) ABSTRACT

A method of manufacturing a semiconductor device includes forming a gate structure on a substrate; forming a sacrificial spacer may be formed on a sidewall of the gate substrate; implanting first impurities into portions of the substrate by a first ion implantation process using the gate structure and the sacrificial spacer as ion implantation masks to form source and drain regions; removing the sacrificial spacer; and implanting second impurities and carbon atoms into portions of the substrate by a second ion implantation process using the gate structure as an ion implantation mask to form source and drain extension regions and carbon doping regions, respectively.

20 Claims, 5 Drawing Sheets

METHODS OF MANUFACTURING SEMICONDUCTOR DEVICES

CLAIM OF PRIORITY

This application claims priority under 35 USC §119 to Korean Patent Application No. 10-2010-0068207 filed in the Korean Intellectual Property Office on Jul. 15, 2010, the contents of which are herein incorporated by reference in their entirety.

BACKGROUND

1. Field

Aspects of the exemplary embodiments relate to methods of manufacturing semiconductor devices, and more particularly to methods of manufacturing complementary metal oxide semiconductor (CMOS) transistors.

2. Description of the Related Art

Semiconductor manufacturing technologies have been developed to improve mobility of carriers by providing stress to a channel region of a transistor. Specifically, a compressive stress may be provided to a channel region of a positive metal oxide semiconductor (PMOS) transistor to improve mobility of holes and tensile stress may be provided to a channel region of a negative metal oxide semiconductor (NMOS) transistor to improve mobility of electrons.

For example, carbon atoms may be ion-implanted to a source/drain region to provide the tensile stress to the channel region of the NMOS transistor. However, the carbon atoms may be inactivated by a subsequent thermal or heat treatment so that the tensile stress provided to the channel region may be reduced.

SUMMARY

One or more exemplary embodiments provide methods of manufacturing semiconductor devices having improved mobility of carriers in a channel region.

According to an aspect of an exemplary embodiment, there is provided a method of manufacturing a semiconductor device. The method may include forming a gate structure on a substrate. A sacrificial spacer may be formed on a sidewall of the gate structure. First impurities may be implanted into portions of the substrate to form source and drain regions by a first ion implantation process using the gate structure and the sacrificial spacer as ion implantation masks. After removing the sacrificial spacer, second impurities and carbon atoms may be implanted into portions of the substrate to form source and drain extension regions and carbon doping regions, respectively, by at least a second ion implantation process using the gate structure as an ion implantation mask.

A heat treatment may be performed about the substrate to activate the first impurities in the source and the drain regions before performing the second ion implantation process. For example, the heat treatment may be carried out at a temperature of about 800° C. to about 1,100° C. for about 0.01 second to about 10 seconds.

The first and the second impurities may include N type impurities. The source and the drain regions may have impurity concentrations higher than those of the source and the drain extension regions, respectively.

The source and the drain extension regions may be adjacent to the source and the drain regions. The source and the drain extension regions may have depths less than depths of the source and the drain regions, respectively.

The source and the drain extension regions and the carbon doping regions may be formed by different ion implantation processes, respectively. After forming the source and the drain extension regions and the carbon doping regions, a thermal treatment process may be performed about the substrate to activate the second impurities in the source and the drain extension regions and carbon atoms in the carbon doping regions. For example, the thermal treatment process may be carried out for several miliseconds or tens of miliseconds.

The carbon doping regions may be adjacent to the source and the drain regions and the source and the drain extension regions. The carbon doping regions may have depths greater than depths of the source and the drain regions.

An epitaxial layer may be formed on the source and the drain regions and the substrate after removing the sacrificial spacer.

The sacrificial spacer may be formed using silicon oxide.

In formation of the gate structure, a gate insulation layer pattern and a gate electrode may be formed on the substrate. A spacer may be formed on sidewalls of the gate insulation layer pattern and the gate electrode.

According to another aspect of an exemplary embodiment, there is provided a method of manufacturing a semiconductor device. The method may include forming a first gate structure and a second gate structure on an NMOS region and a PMOS region of a substrate, respectively. A first sacrificial spacer and a second sacrificial spacer may be formed on sidewalls of the first gate structure and the second gate structure, respectively. First impurities may be implanted into the NMOS region to form first source and drain regions by a first ion implantation process using the first gate structure and the first sacrificial spacer as ion implantation masks. Second impurities may be implanted into the PMOS region to form second source and drain regions by a second ion implantation process using the second gate structure and the second sacrificial spacer as ion implantation masks. The first and the second sacrificial spacers may be removed. Third impurities may be implanted into the PMOS region to form second source and drain extension regions by a third ion implantation process using the second gate structure as an ion implantation mask. Fourth impurities and carbon atoms may be implanted into the NMOS region to form a first source extension region and a first drain extension region and carbon doping regions, respectively by at least a fourth ion implantation process using the first gate structure as an ion implantation mask.

In formation of the second source and drain regions, the substrate may be partially removed using the second gate structure and the second sacrificial spacer as etching masks to form recesses in the PMOS region. A first epitaxial layer may be formed to fill the recesses. The second impurities may be implanted into the first epitaxial layer. For example, the first epitaxial layer may include silicon-germanium (Si—Ge).

A heat treatment may be performed about the substrate to activate the first and the second impurities in the first and the second source and drain regions before the fourth ion implantation process. For example, the heat treatment may be carried out at a temperature of about 800° C. to about 1,100° C. for about 0.01 second to about 10 seconds.

The first and the fourth impurities may include N type impurities. The second and the third impurities may include P type impurities. The first and the second source and drain regions may have impurity concentrations larger than those of the first and the second source and drain extension regions.

The carbon doping regions may be adjacent to the first source and drain regions and the first source and drain extension regions. The carbon doping regions may have depths larger than those of the first source and drain regions.

A second epitaxial layer may be formed on the first source and drain regions and the NMOS region after removing the sacrificial spacers.

Carbon doping regions may be formed after forming source and drain regions and after a heat treatment. Therefore, carbon atoms in the carbon doping regions may be prevented from being deactivated by the heat treatment. Additionally, a distance between adjacent carbon doping regions may be reduced by sacrificial spacers, so that tensile stress applied to a channel region may be increased and operation current characteristics may be enhanced.

According to still another aspect of an exemplary embodiment, there is provided a method of manufacturing a semiconductor device. The method may include forming a gate structure on a substrate; forming source and drain regions in the substrate; performing a first heat treatment process on the substrate; and forming a carbon doping region in the substrate beneath the source and drain regions.

The first heat treatment may be performed on the substrate at a temperature of about 800° C. to about 1,100° C. for about 0.01 second to about 10 seconds.

Carbon atoms may be doped in the carbon doping region with a dose concentration in a range of about $5 \times 10^{19}$ atoms/cm$^2$ to about $5 \times 10^{21}$ atoms/cm$^2$.

The carbon doping region may have a depth in a range of about 10 Å to about 1,000 Å from a surface of the substrate.

The method may further include performing a second heat treatment process at a temperature of about 1,000° C. to 1,300° C. for about several milliseconds to about hundreds of milliseconds on the substrate after forming the carbon doping region.

BRIEF DESCRIPTION OF THE DRAWINGS

The above and/or other aspects of the present inventive concept will be more apparent by describing certain exemplary embodiments with reference to the accompanying drawings, in which.

DETAILED DESCRIPTION

Figure 1:
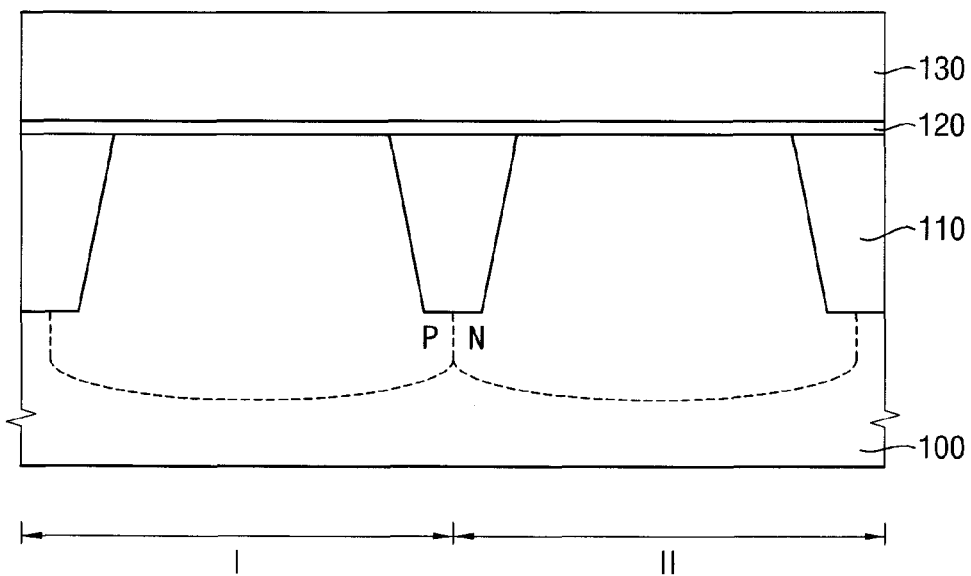
FIGS. 1-5 are cross-sectional views illustrating a method of manufacturing a semiconductor device according to exemplary embodiments.

The present inventive concept will be described more fully hereinafter with reference to the accompanying drawings, in which one or more exemplary embodiments are described in greater detail. The present inventive concept may, however, be embodied in many different forms and should not be construed as limited to the exemplary embodiments set forth herein. Rather, these exemplary embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be explained in detail with reference to the accompanying drawings.

FIGS. 1-5 are cross-sectional views illustrating a method of manufacturing a semiconductor device in accordance with exemplary embodiments.

Referring to FIG. 1, a substrate 100 including an NMOS region I and a PMOS region II may be provided. The substrate 100 may include, but is not limited to, a semiconductor material such as single crystalline silicon (Si), single crystalline germanium (Ge).

An isolation layer 110 may be formed on the substrate 10 by an isolation process for example but not limited to a shallow trench isolation (STI) process or a thermal oxidation process. The isolation layer 110 may define active regions of the substrate 100.

The NMOS region I of the substrate 100 may be doped with P type impurities, so that a P type well may be provided in the substrate 100. The PMOS region II of the substrate 100 may be doped with N type impurities, such that an N type well may be provided in the substrate 100. The P type well may be adjacent to the N type well by interposing the isolation layer 110 therebetween.

A gate insulation layer 120 may be formed on the substrate 100. The gate insulation layer 120 may be formed using, for example but not limited to, silicon oxide (SiOx), silicon oxynitride (SiOxNy) and/or metal oxide (MOx) having a relatively high dielectric constant. Examples of metal oxide included in the gate insulation layer 120 may include, but are not limited to, hafnium oxide (HfOx), zirconium oxide (ZrOx), aluminum oxide (AlOx), and/or tantalum oxide (TaOx).

The gate insulation layer 120 may be formed by performing a thermal oxidation process about an upper portion of the substrate 100, so that the gate insulation layer 120 may include silicon oxide. The gate insulation layer 120 may be formed by performing a plasma nitration process or a thermal nitration process about a silicon oxide layer after forming the silicon oxide layer on the substrate 100. Here, the gate insulation layer 120 may include silicon oxynitride. Additionally, the silicon oxide layer may be obtained by, for example but not limited to, a chemical vapor deposition (CVD) process or a low pressure chemical vapor deposition (LPCVD) process. Furthermore, when the gate insulation layer 120 includes metal oxide, the gate insulation layer 120 may be obtained by, for example but not limited to, a CVD process, an atomic layer deposition (ALD) process, a sputtering process, or an evaporation process.

A gate conductive layer 130 may be formed on the gate insulation layer 120. The gate conductive layer 130 may be formed using, for example but not limited to, polysilicon by a CVD process or a plasma enhanced chemical vapor deposition (PECVD) process. In the CVD process for forming the gate conductive layer 130, a silane ($SiH_4$) gas may be used as a source gas. The CVD process for forming the gate conductive layer 130 may be carried out at a temperature of about 600° C. to about 650° C. under a pressure in a range of about 25 Pa to about 150 Pa. For example, the gate conductive layer 130 may have a thickness below about 1,000 Å.

The gate conductive layer 130 may have proper work functions for an NMOS transistor and a PMOS transistor provided in the NMOS region I and the PMOS region II, respectively. For example, the gate conductive layer 130 may be doped with N type impurities and/or P type impurities in accordance with conductive types of the NMOS and the PMOS transistors.

Figure 2:
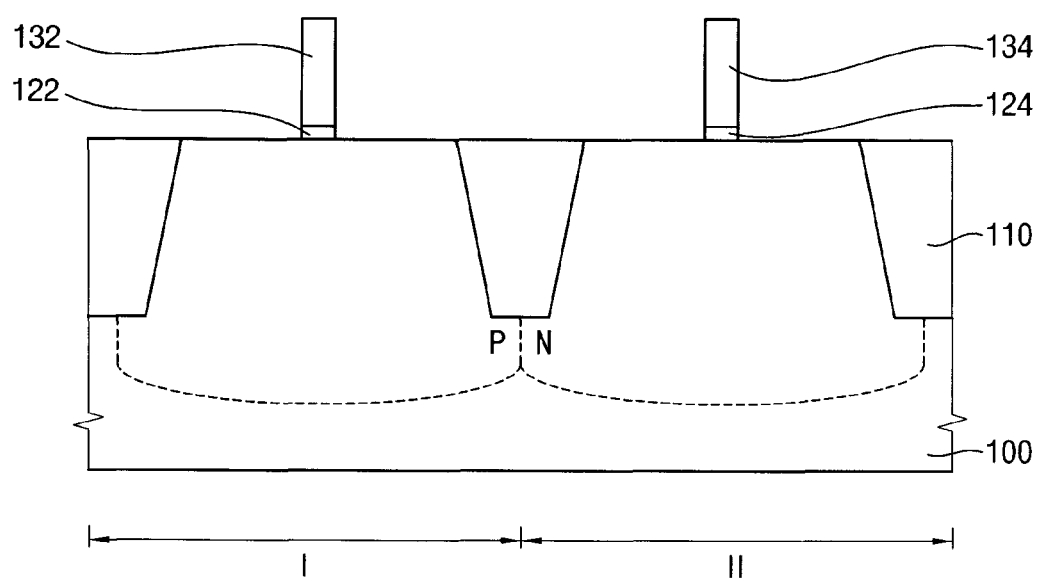

Referring to FIG. 2, a first mask (not illustrated) may be formed on the gate conductive layer 130, and then the gate conductive layer 130 and the gate insulation layer 120 may be patterned using the first mask as an etching mask. Accordingly, a first gate electrode 132 and a first gate insulation layer pattern 122 may be formed in the NMOS region I of the substrate 100, and also a second gate electrode 134 and a second gate insulation layer pattern 124 may be formed in the PMOS region II of the substrate 100. Then, the first mask may be removed from the first and the second gate electrodes 132 and 134. The first mask may be removed by an ashing process and/or a stripping process.

Figure 3:
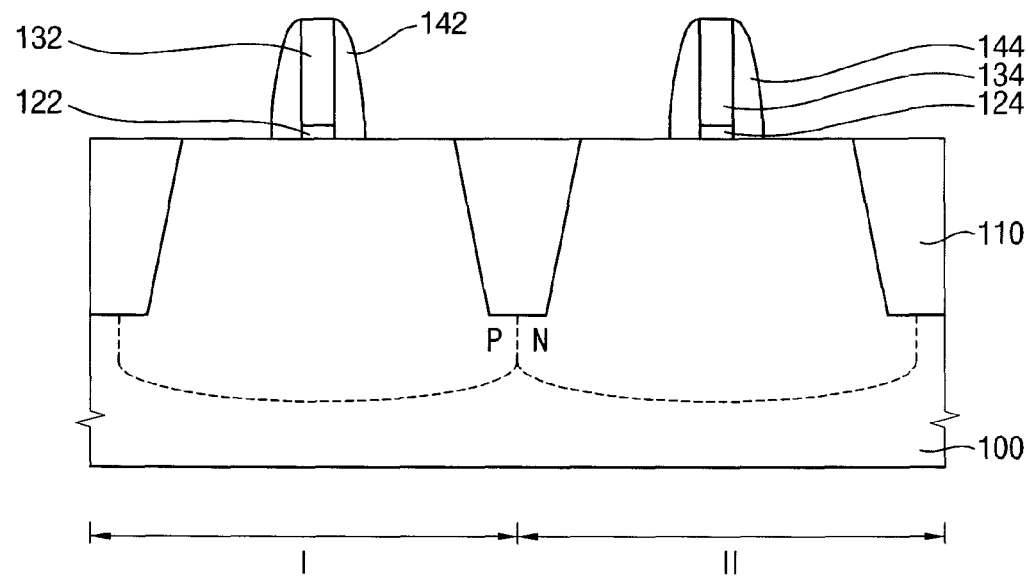

Referring to FIG. 3, a first spacer 142 may be formed on sidewalls of the first gate electrode 132 and the first gate insulation layer pattern 122. Additionally, a second spacer 144 may be formed on sidewalls of the second gate electrode 134 and the second gate insulation layer pattern 124. Thus, a first gate structure including the first gate electrode 132, the first gate insulation layer pattern 122 and the first spacer 142 may be provided in the NMOS region I of the substrate 100. Further, a second gate structure including the second gate electrode 134, the second gate insulation layer pattern 124 and the second spacer 144 may be formed in the PMOS region II of the substrate 100.

Each of the first and the second spacers 142 and 144 may be formed using silicon nitride. A spacer formation layer (not illustrated) may be formed on the substrate 100 to cover the first and the second gate electrodes 132 and 134, and the first and the second gate insulation layer patterns 122 and 124. The spacer formation layer may be formed using, for example but not limited to, silicon nitride by a CVD process or a PECVD process. The spacer formation layer may be partially etched by an anisotropic etching process to provide the first and the second spacers 142 and 144. Before forming the first and the second spacers 142 and 144, a screen oxide layer (not illustrated) may be additionally formed on the first and the second gate electrodes 132 and 134, and on the first and the second gate insulation layer patterns 122 and 124. Hence, the screen oxide layer may prevent stresses being applied to the first and the second gate electrodes 132 and 134, and also to the first and the second gate insulation layer patterns 122 and 124 while forming the first and the second spacers 142 and 144.

Each of the first and the second spacers 142 and 144 may have a multi layer structure that includes a first nitride film, an oxide film, a second nitride film, etc.

Figure 4:
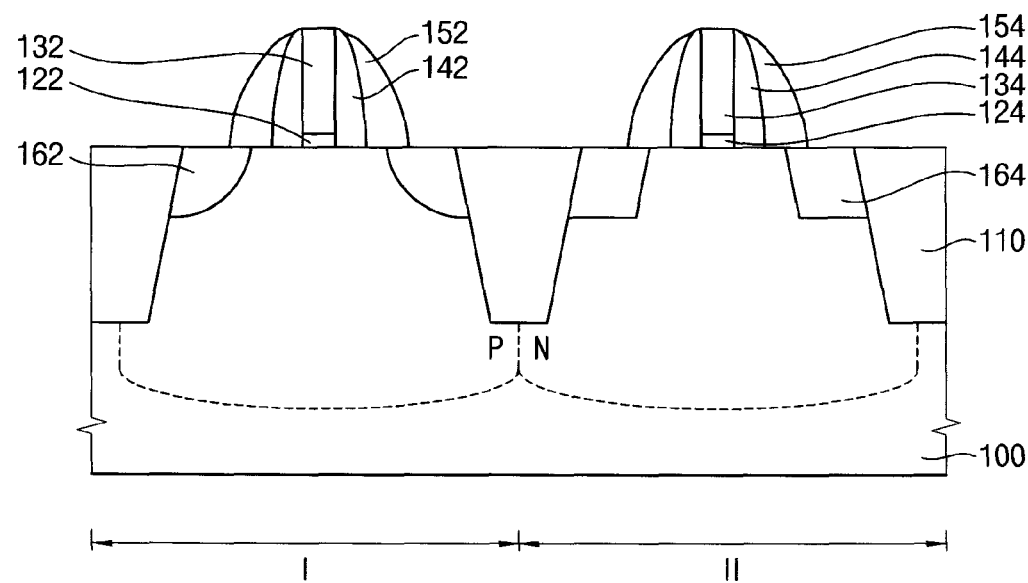

Referring to FIG. 4, a first sacrificial spacer 152 and a second sacrificial spacer 154 may be formed on sidewalls of the first spacer 142 and the second spacer 144, respectively. Each of the first and the second sacrificial spacers 152 and 154 may be formed using silicon oxide. A sacrificial layer (not illustrated) covering the first and the second gate structures may be formed on the substrate 100, and then the sacrificial layer may be partially etched by an anisotropic etching process, so that the first and the second sacrificial spacers 152 and 154 may be provided on the sidewalls of the first and the second spacers 142 and 144.

A second mask (not illustrated) may be formed on the substrate 100 to cover the PMOS region II of the substrate 100. First impurities may be doped into first portions of the substrate 100 by a first ion implantation process using the second mask, the first gate structure and the first sacrificial spacer 152 as ion implantation masks. Thus, first source and drain regions 162 may be formed at the first portions of the substrate 100. In this case, the first impurities may be diffused in the upper portion of the substrate 100, so that the first source and drain regions 162 may be formed extended beneath the first sacrificial spacer 152. After forming the first source and drain regions 162, the second mask may be removed from the substrate 100.

A third mask (not illustrated) may be formed on the substrate 100 to cover the NMOS region I of the substrate 100. The upper portion of the substrate 100 may be partially removed using the third mask, the second gate structure and the second sacrificial spacer 154 as etching masks to form recesses (not illustrated) in the PMOS region II of the substrate 100. That is, the recesses may be formed at second portions of the substrate 100. Each of the recesses may extend beneath the second sacrificial spacer 154. The third mask may remain on the substrate 100 after forming the recesses.

A silicon-germanium (Si—Ge) layer may be formed in the PMOS region II to fill the recesses. The silicon-germanium layer may be obtained by a selective epitaxial growth (SEG) process using a source gas that includes dichlorosilane ($SiH_2Cl_2$) and germane ($GeH_4$). Second impurities may be doped into the silicon-germanium layer by a second ion implantation process using the third mask, the second gate structure and the second sacrificial spacer 154 as ion implantation masks. Hence, second source and drain regions 164 may be formed in the PMOS region II. The second impurities may be implanted into other portions of the substrate 100 on which the silicon-germanium layer may not be positioned. The third mask may be removed after forming the second source and drain regions 164.

The first impurities may include N type impurities containing, for example but not limited to, phosphorous (P) or arsenic (As). The second impurities may include P type impurities containing, for example but not limited to, boron (B). Each of the first and the second impurities may be implanted with a dose concentration of about $5\times10^{15}$ atoms/cm$^2$ and an acceleration energy of about 30 KeV to about 40 KeV.

After forming the first and the second source and drain regions 162 and 164, a heat treatment may be performed about the substrate 100 at a temperature of about 800° C. to about 1,100° C. for about 0.01 second to about 10 seconds. The heat treatment may activate the first and the second impurities and may reduce crystalline defects in the first and the second source and drain regions 162 and 164.

Figure 5:
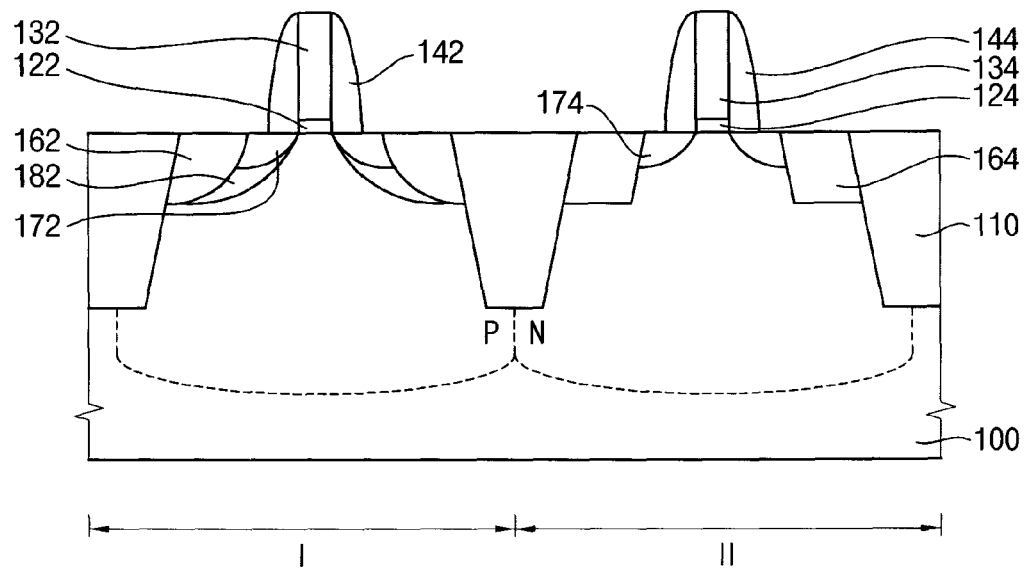

Referring to FIG. 5, the first and the second sacrificial spacers 152 and 154 may be removed from the first and the second spacers 142 and 144. The first and the second sacrificial spacers 152 and 154 may be removed by a dry etching process using oxygen ($O_2$) plasma.

A fourth mask (not illustrated) may be formed on the substrate 100 to cover the NMOS region I. Third impurities may be doped into portions of the substrate 100 in the PMOS region II by a third ion implantation process using the fourth mask and the second gate structure as ion implantation masks. Thus, second source and drain extension regions 174 may be formed adjacent to the second source and drain regions. The third impurities may be diffused at the upper portion of the substrate 100, so that the second source and drain extension regions 174 may be extended beneath the second spacer 144. The third impurities may include P type impurities. Each of the second source and drain extension regions 174 may have an impurity concentration lower than that of each second source and drain regions 164. After forming the second source and drain extension regions 174, the fourth mask may be removed from the substrate 100.

A fifth mask (not illustrated) may be formed on the substrate 100 to cover the PMOS region II. Fourth impurities may be doped into portions of the substrate 100 by a fourth ion implantation process using the fifth mask and the first gate structure as ion implantation masks. Hence, first source and drain extension regions 172 may be formed adjacent to the first source and drain regions 162. The fourth impurities may be diffused at the upper portion of the substrate 100, so that the first source and drain extension regions 172 may be extend beneath the first spacer 142. The fourth impurities may include N type impurities. The fourth impurities may include, for example but not limited to, arsenic and/or phosphorous. The first source and drain extension regions 172 may have impurities concentrations lower than those of the first source and drain regions 162, respectively.

The first and the second source and drain extension regions 172 and 174 may make contact with the first and the second source and drain regions 162 and 164, respectively. Further, each of first and the second source and drain extension regions 172 and 174 may have a depth less than a depth of each of the first and the second source and drain regions 162 and 164.

Carbon atoms may be doped into portions of the substrate 100 under the first source and drain regions 162 and the first source and drain extension regions 172, so that carbon doping regions 182 may be provided beneath the first source and drain regions 162 and the first source and drain extension region 172. For example, the carbon doping regions 182 may make contact with both of the first source and drain regions 162 and the first source and drain extension region 172. The carbon doping regions 182 may be obtained by a fifth ion implantation process using the fifth mask and the first gate structure as ion implantation masks. The carbon doping regions 182 may be positioned at relatively deep portions of the substrate 100. For example, the carbon doping region 182 may have a depth in a range of about 10 Å to about 1,000 Å from a surface of the substrate 100.

The carbon doping regions 182 may be formed using a source gas that includes $C_5H_5$ or $C_7H_7$. The carbon atoms may be doped with a dose concentration in a range of about $5\times10^{19}$ atoms/cm$^2$ to about $5\times10^{21}$ atoms/cm$^2$. The fifth and the fourth ion implantation processes may be simultaneously executed. Alternatively, the fifth ion implantation process may be carried out before or after the fourth ion implantation process.

A thermal treatment process may be performed about the substrate 100 to activate the impurities and the carbon atoms doped in the substrate 100. The thermal treatment process may be carried out using, for example but not limited to, a xenon (Xe) flash lamp and/or a laser beam. The thermal treatment process may be executed for a relatively short period in a range of about several milliseconds to about hundreds of milliseconds at a relatively high temperature, which may be referred to as a millisecond annealing (MSA) process. That is, the impurities and the carbon atoms in the substrate 100 may be activated by the MSA process. For example, the MSA process may be carried out at a temperature of about 1,000° C. to 1,300° C.

Each of the carbon doping regions 182 may have a structure in which silicon atoms and carbon atoms are combined to form silicon carbide ($SiC_x$) when the substrate 100 include silicon.

As the formations of the carbon doping regions 182, the NMOS transistor having the first gate structure, the first source and drain regions 162, the first source and drain extension regions 172 and the carbon doping regions 182 may be provided in the NMOS region I of the substrate 100. Further, the PMOS transistor including the second gate structure, the second source and drain regions 164 and the second source and drain extension regions 174 may be provided in the PMOS region II of the substrate 100.

After forming the carbon doping regions 182, a metal silicide layer (not illustrated) may be formed on the first and the second source and drain regions 162 and 164, and on the first and the second source and drain extension regions 172 and 174. The metal silicide layer may include, but is not limited to, cobalt silicide (CoSix), titanium silicide (TiSix), and/or nickel silicide (NiSix). The metal silicide layer may be doped with N type impurities or P type impurities to enhance a conductivity of the metal silicide layer.

The heat treatment may be performed about the substrate 100 after forming the first and the second source and drain regions 162 and 164, and then the first and the second source and drain extension regions 172 and 174 and the carbon doping regions 182 may be formed adjacent to the first source drain regions 162 and the first source and drain extension regions 172. Accordingly, the carbon atoms in the carbon doping regions 182 may be prevented from being deactivated by the heat treatment, whereas the carbon atoms in the carbon doping regions 182 may be deactivated when the first source and drain extension regions 172 and the carbon doping regions 182 are formed before forming the first source and drain regions 162 and the heat treatment is performed. As a result, sufficient tensile stress may be applied to a channel region of the NMOS transistor to enhance operation current characteristics of the NMOS transistor in the semiconductor device. Further, as a distance between adjacent carbon doping regions 182 is reduced by the first sacrificial spacer 152, the tensile stress applied to the channel region of the NMOS transistor may be increased.

Figure 6:
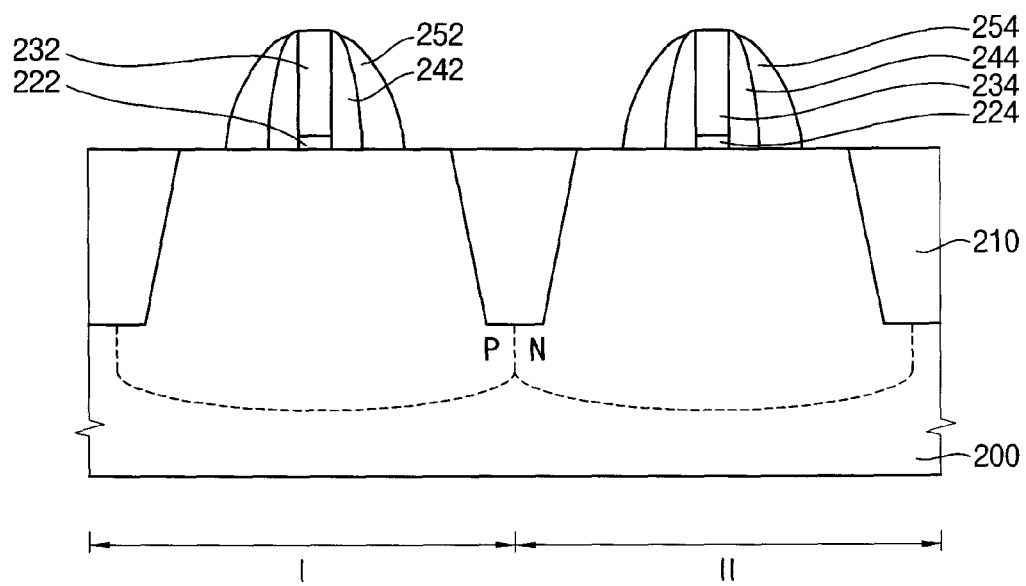
FIGS. 6-8 are cross-sectional views illustrating a method of manufacturing a semiconductor device according to exemplary embodiments.
Figure 7:
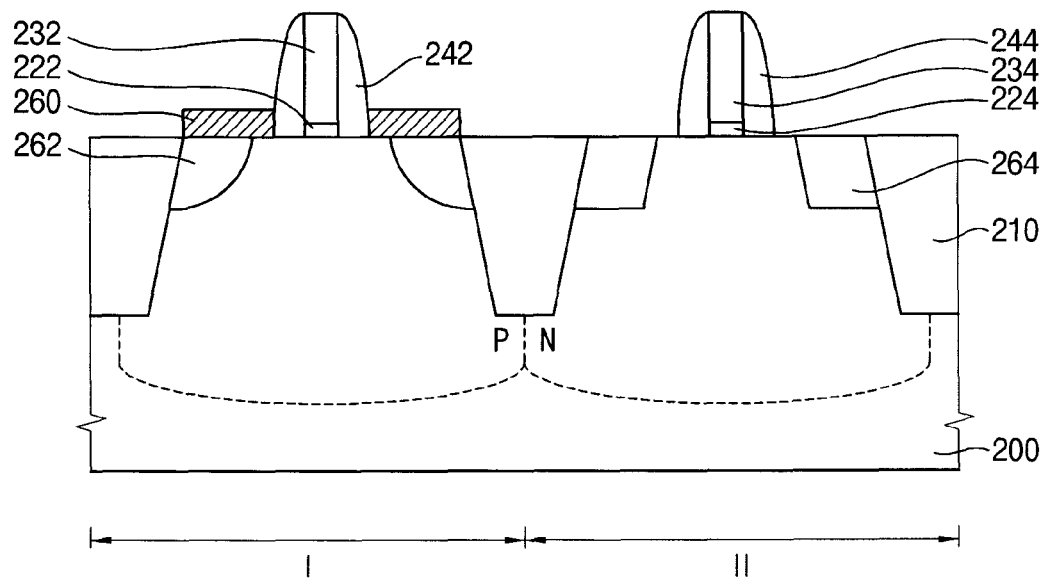
Figure 8:
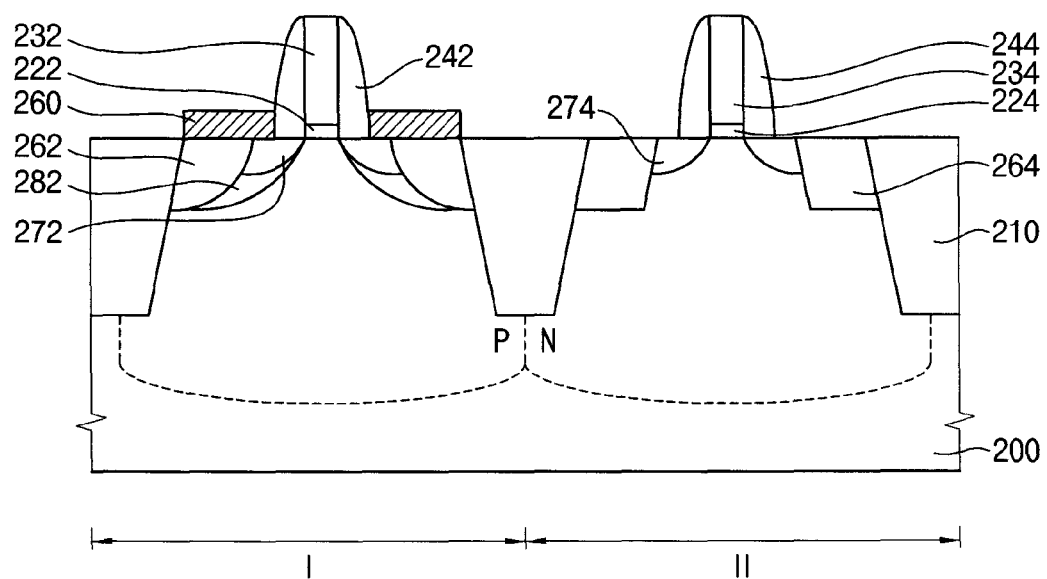

FIGS. 6-8 are cross-sectional views illustrating a method of manufacturing a semiconductor device in accordance with exemplary embodiments.

Referring to FIG. 6, processes substantially the same as or substantially similar to those described with reference to FIGS. 1-3 may be performed about the substrate 200. Accordingly, an isolation layer 200 may be formed on the substrate 200, and then a P type well may be formed in an NMOS region I of the substrate 200 whereas an N type well may be formed in a PMOS region II of the substrate 200. Further, a first gate insulation layer pattern 222, a first gate electrode 232, a first spacer 242 and a first sacrificial spacer 252 may be provided in the NMOS region I of the substrate 200, and also a second gate insulation layer pattern 224, a second gate electrode 234, a second spacer 244 and a second sacrificial spacer 254 may be formed in the PMOS region II of the substrate 200. The first gate electrode 232, the first gate insulation layer pattern 222 and the first spacer 242 may provide in a first gate structure in the NMOS region I of the substrate 200. The second gate electrode 234, the second gate insulation layer pattern 224 and the second spacer 244 may provide a second gate structure in the PMOS region II of the substrate 200.

Referring to FIG. 7, processes substantially the same as or substantially similar to those described with reference to FIG. 4 may be performed about the substrate 200. Accordingly, first source and drain regions 262 may be formed in the NMOS region I of the substrate 200 and second source and drain regions 264 may be formed in the PMOS region II of the substrate 200. After forming the first and the second source and drain regions 262 and 264, a heat treatment may be additionally carried out at a temperature of about 800° C. to about 1,100° C. for about 0.01 second to about 10 seconds. The first and the second sacrificial spacers 252 and 254 may be removed after forming the first and the second source and drain regions 262 and 264, or after the heat treatment.

A first mask (not illustrated) may be formed on the substrate 200 to cover the PMOS region II, and then an epitaxial layer 260 may be formed on the first source and drain regions 262 by an SEG process. The SEG process may include, for example, a CVD process that uses a silicon source gas including dichlorosilane ($SiH_2Cl_2$), so that epitaxial layer 260 may include single crystalline silicon.

A thermal treatment process may be performed before performing the SEG process. For example, the thermal treatment process may be carried out at a temperature of about 900° C. for a time above about one minute. Since the thermal treatment process may be performed before forming source and drain extension regions 272 and 274 (see FIG. 8), characteristics of channel regions of transistor may not be deteriorated.

The epitaxial layer 260 may be obtained using an impurity gas and the silicon source gas, so that the epitaxial layer 260 may include single crystalline silicon doped with impurities. The impurity gas may include, for example but not limited to, phosphorous and/or arsenic. The epitaxial layer 260 may be additionally formed at a portion of the substrate 200 from which the first sacrificial spacer 252 is removed. Therefore, a leakage current may be prevented even though a contact plug or a pad (not illustrated) electrically connected to the first source and drain regions 262 may be misaligned relative to the first source and drain regions 262. For example, the epitaxial layer 260 may have a relatively small thickness in a range of about 10 Å to about 500 Å.

Referring to FIG. 8, processes substantially the same as or substantially similar to those described with reference to FIG. 5 may be performed about the substrate 200. That is, a second mask (not illustrated) may be formed on the substrate 200 to cover the NMOS region I. First impurities may be doped into portions of the substrate 200 by a first ion implantation process using the second mask and the second gate structure as ion implantation masks. Thus, second source and drain extension regions 274 may be formed adjacent to the second source and drain regions 264. The first impurities may include P type impurities. The second source and drain extension regions 274 may have impurity concentrations lower than those of the second source and drain regions 264, respectively.

A third mask (not illustrated) may be formed on the substrate 200 to cover the PMOS region II. Second impurities may be doped into portions of the substrate 200 by a second ion implantation process using the third mask and the first gate structure as ion implantation masks. Hence, first source and drain extension regions 272 may be provided adjacent to the first source and drain regions 262. The second impurities may include N type impurities. The first source and drain extension regions 272 may have impurity concentrations lower than those of the first source and drain regions 262, respectively.

Carbon atoms may be doped into portions of the substrate 200 by a third ion implantation process using the third mask and the first gate structure as ion implantation masks, so that carbon doping regions 282 may be formed beneath the first source and drain regions 262 and the first source and drain extension regions 272. The carbon doping regions 282 may make contact with the first source and drain regions 262 and the first source and drain extension regions 272. The carbon doping regions 282 may have relative large depths from a surface of the substrate 200.

The third ion implantation process and the second ion implantation process may be performed simultaneously. Alternatively, the third ion implantation process may be carried out before the second ion implantation process.

An MSA process may be performed about the substrate 200 to activate the impurities and the carbon atoms in the substrate 200. Additionally, metal silicide layers (not illustrated) may be formed on the first and the second source and drain regions 262 and 264, and on the first and the second source and drain extension regions 272 and 274.

The first and the second source and drain extension regions 272 and 274 and the carbon doping regions 282 may be formed after forming the first and the second source and drain regions 262 and 264 and after performing the heat treatment. Accordingly, carbon atoms in the carbon doping regions 282 may be prevented from being deactivated by the heat treatment. Additionally, as a distance between adjacent carbon doping regions 282 is reduced, tensile stress applied to a channel region of a transistor may be increased. Furthermore, the epitaxial layer 260 may be positioned over the carbon doping region 282, so that the carbon atoms may be prevented from being consumed while forming the metal silicide layers.

The above-described methods may be applied for manufacturing other transistors, for example but not limited to, a planar type transistor, a fin shape field effect transistor (FinFET), etc.

Figure 9:
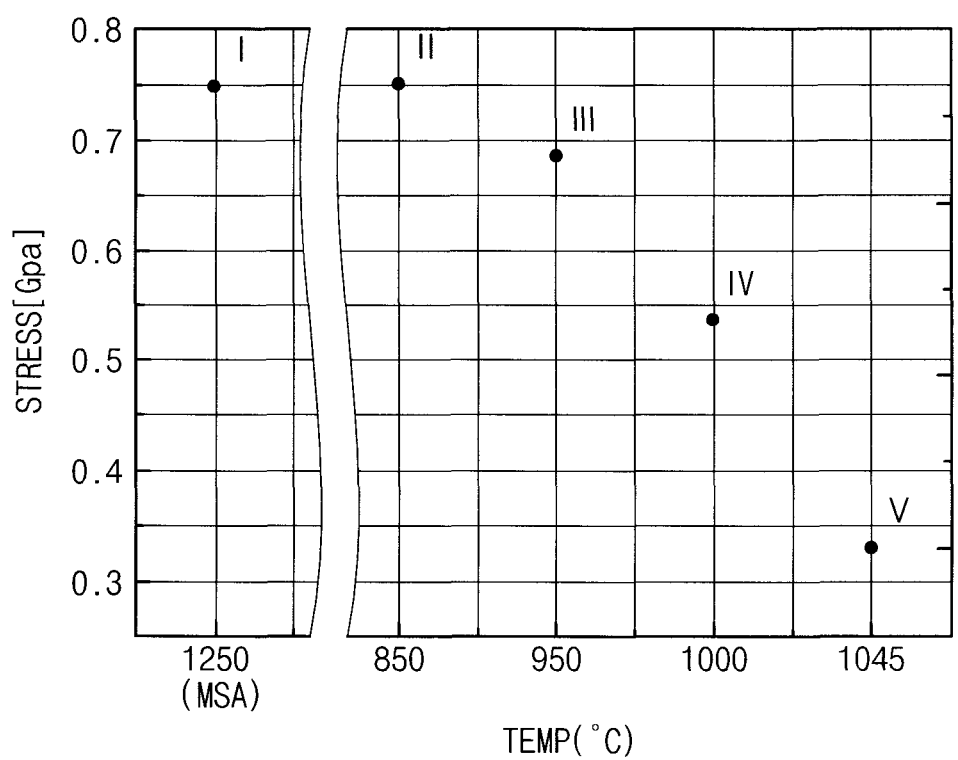
FIG. 9 is a graph illustrating a stress variation in accordance with additional heat treatments performed about carbon doping regions according to exemplary embodiments.

FIG. 9 is a graph illustrating a stress variation change in accordance with an additional heat treatment performed about carbon doping regions. In FIG. 9, the carbon doping regions were formed by implanting carbon atoms into substrates with dose concentrations of about $5\times10^{15}$ atoms/cm$^2$ to have depths of about 45 nm from surfaces of the substrates. In FIG. 9, "I" indicates a value of stress measured after performing only a MSA process at a temperature of about 1,250° C. Further, "II", "III", "IV" and "V" denote values of stresses measured after performing additional heat treatments with the MSA process at temperatures of about 850° C., about 950° C., about 1,000° C. and about 1,045° C., respectively.

Referring to FIG. 9, when only the MSA process was carried out (I), the value of stress was about 0.75 GPa. However, when the additional heat treatments were carried out with the MSA process (II, III, IV and V), the values of stresses were drastically decreased, for example, to about 0.32 GPa (V). When source and drain regions are formed after forming carbon doping regions, stress generated in the carbon doping regions may be decreased by the heat treatment performed about the source and the drain regions. However, according to exemplary embodiments, the stress in the carbon-doped region may not be reduced because the carbon doping regions may be formed after forming the source and the drain regions and performing the heat treatment.

According to exemplary embodiments, carbon doping regions may be formed after forming source and drain regions and after performing a heat treatment. Therefore, carbon atoms in the carbon doping regions may be prevented from being deactivated by the heat treatment. Additionally, a distance between adjacent carbon doping regions may be reduced by sacrificial spacers, so that tensile stress applied to a channel region of a transistor may be increased.

Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of manufacturing a semiconductor device, comprising:
   forming a gate structure on a substrate;
   forming a sacrificial spacer on a sidewall of the gate structure;
   implanting first impurities into portions of the substrate to form a source region and a drain region by a first ion implantation process using the gate structure and the sacrificial spacer as ion implantation masks;
   removing the sacrificial spacer; and
   subsequent to forming the source region and the drain region and removing the sacrificial spacer, implanting second impurities and carbon atoms into portions of the substrate to form a source extension region and a drain extension region and carbon doping regions, respectively, by at least second ion implantation process using the gate structure as an ion implantation mask.

2. The method of claim 1, further comprising performing a heat treatment about the substrate to activate the first impurities in the source region and the drain region before performing the second ion implantation process.

3. The method of claim 1, wherein the first and the second impurities include N type impurities, and the source region and the drain region have impurity concentrations higher than those of the source extension regions and the drain extension regions, respectively.

4. The method of claim 1, wherein the source extension region and the drain extension region are adjacent to the source region and the drain region, respectively, and the source extension region and the drain extension region have depths less than depths of the source region and the drain region, respectively.

5. The method of claim 1, wherein the source extension region and the drain extension region and the carbon doping regions are formed by different ion implantation processes, respectively.

6. The method of claim 1, further comprising, after forming the source extension region and the drain extension region and the carbon doping regions, performing a thermal treatment process about the substrate to activate the second impurities in the source extension region and the drain extension region and carbon atoms in the carbon doping regions.

7. The method of claim 1, wherein the carbon doping regions are adjacent to the source region and the drain region and the source extension region and the drain extension region, and the carbon doping regions have depths greater than depths of the source region and the drain region.

8. The method of claim 1, further comprising forming an epitaxial layer on the source region and the drain region and the substrate after removing the sacrificial spacer.

9. The method of claim 1, wherein forming the gate structure comprises:
   forming a gate insulation layer pattern and a gate electrode on the substrate; and
   forming a spacer on sidewalls of the gate insulation layer pattern and the gate electrode.

10. A method of manufacturing a semiconductor device, comprising:
    forming a first gate structure and a second gate structure on an NMOS region and a PMOS region of a substrate, respectively;

forming a first sacrificial spacer and a second sacrificial spacer on sidewalls of the first gate structure and the second gate structure, respectively;

implanting first impurities into the NMOS region to form a first source region and a first drain region by a first ion implantation process using the first gate structure and the first sacrificial spacer as ion implantation masks;

implanting second impurities into the PMOS region to form a second source region and a second drain region by a second ion implantation process using the second gate structure and the second sacrificial spacer as ion implantation masks;

removing the first and the second sacrificial spacers;

implanting third impurities into the PMOS region to form a second source extension region and a second drain extension region by a third ion implantation process using the second gate structure as an ion implantation mask; and subsequent to the implanting the second impurities, the removing the first and second sacrificial spacers, and the implanting the third impurities, implanting fourth impurities and carbon atoms into the NMOS region to form a first source extension region and a first drain extension region and carbon doping regions, respectively, by at least a fourth ion implantation process using the first gate structure as an ion implantation mask.

11. The method of claim 10, wherein forming the second source region and the second drain region comprises:

partially removing the substrate using the second gate structure and the second sacrificial spacer as etching masks to form recesses in the PMOS region;

forming a first epitaxial layer to fill the recesses; and implanting the second impurities into the first epitaxial layer.

12. The method of claim 10, further comprising performing a heat treatment to activate the first and the second impurities in the first and the second source and drain regions before the fourth ion implantation process.

13. The method of claim 10, wherein the first and the fourth impurities include N type impurities, and the second and the third impurities include P type impurities, and wherein the first and the second source and drain regions have impurity concentrations larger than those of the first and the second source and drain extension regions.

14. The method of claim 10, wherein the carbon doping regions are adjacent to the first source region and the first drain region and the first source extension region and the first drain extension region, and the carbon doping regions have depths greater than depths of the first source region and the first drain region.

15. The method of claim 10, further comprising forming a second epitaxial layer on the first source region and the first drain region and the NMOS region after removing the sacrificial spacers.

16. A method of manufacturing a semiconductor device, comprising:

forming a gate structure on a substrate;

forming source and drain regions in the substrate;

performing a first heat treatment process on the substrate; and forming a carbon doping region in the substrate beneath the source and drain regions, subsequent to forming the source and drain regions.

17. The method of claim 16, wherein the first heat treatment is performed on the substrate at a temperature of about 800° C. to about 1,100° C. for about 0.01 second to about 10 seconds.

18. The method of claim 16, wherein carbon atoms are doped in the carbon doping region with a dose concentration in a range of about $5 \times 10^{19}$ atoms/cm$^2$ to about $5 \times 10^{21}$ atoms/cm$^2$.

19. The method of claim 16, wherein the carbon doping region has a depth in a range of about 10 Å to about 1,000 Å from a surface of the substrate.

20. The method of claim 16, further comprising performing a second heat treatment process at a temperature of about 1,000° C. to 1,300° C. for about several milliseconds to about hundreds of milliseconds on the substrate after forming the carbon doping region.

* * * * *